United States Patent
Hu et al.

(10) Patent No.: US 9,604,543 B2
(45) Date of Patent: Mar. 28, 2017

(54) APPARATUS AND METHOD FOR AUTOMATIC GROUND FAULT LOCATION DETERMINATION IN HIGH RESISTANCE GROUNDED MOTOR DRIVE SYSTEM

(71) Applicants: Jiangang Hu, Grafton, WI (US);
Lixiang Wei, Mequon, WI (US);
Zhijun Liu, Menomonee Falls, WI (US); Jeffrey D. McGuire, Franklin, WI (US)

(72) Inventors: Jiangang Hu, Grafton, WI (US);
Lixiang Wei, Mequon, WI (US);
Zhijun Liu, Menomonee Falls, WI (US); Jeffrey D. McGuire, Franklin, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 203 days.

(21) Appl. No.: 14/296,502

(22) Filed: Jun. 5, 2014

(65) Prior Publication Data
US 2015/0355262 A1    Dec. 10, 2015

(51) Int. Cl.
| | | |
|---|---|---|
| *G01R 31/02* | (2006.01) |
| *G01R 31/08* | (2006.01) |
| *H02H 3/16* | (2006.01) |
| *B60L 3/00* | (2006.01) |
| *H02H 1/00* | (2006.01) |
| *H02P 29/032* | (2016.01) |
| *H02P 29/024* | (2016.01) |

(Continued)

(52) U.S. Cl.
CPC .......... *B60L 3/0069* (2013.01); *G01R 31/025* (2013.01); *G01R 31/08* (2013.01); *H02H 1/0092* (2013.01); *H02H 3/16* (2013.01); *H02P 29/0241* (2016.02); *H02P 29/032* (2016.02); *G01R 31/086* (2013.01); *G01R 31/40* (2013.01); *H02M 1/32* (2013.01); *Y02T 10/642* (2013.01)

(58) Field of Classification Search
CPC .... G01R 31/025; G01R 31/08; G01R 31/086; G01R 31/40; G01R 31/42; H02H 1/0092; H02H 3/16; H02M 1/32; B60L 3/0069
USPC ............... 324/500, 509, 512, 528, 531, 555
See application file for complete search history.

(56) References Cited

U.S. PATENT DOCUMENTS

| | | |
|---|---|---|
| 5,909,367 A | 6/1999 | Change |
| 6,348,800 B1 | 2/2002 | Haensgen et al. |
| 6,984,988 B2 | 1/2006 | Yamamoto |

(Continued)

FOREIGN PATENT DOCUMENTS

| | | |
|---|---|---|
| EP | 1914557 A2 | 4/2008 |
| EP | 2439827 A2 | 4/2012 |

OTHER PUBLICATIONS

European Search Report, EP Application No. 15170429.3-1807, mailed Jan. 8, 2016, completed Dec. 21, 2015, the Hague, 7 pgs.

*Primary Examiner* — Hoai-An D Nguyen
(74) *Attorney, Agent, or Firm* — Fay Sharpe LLP

(57) ABSTRACT

Methods an apparatus are presented for identifying ground fault locations in multi-drive systems in which individual drives perform self-diagnosis for detected faults based on an identified fault signal frequency while the system drives continue operation, and a ground fault location system identifies suspected drives and individually confirms or exonerates individual drives by selective command speed adjustment while the drives remain operational within system tolerance ranges.

18 Claims, 8 Drawing Sheets

(51) Int. Cl.
*H02M 1/32* (2007.01)
*G01R 31/40* (2014.01)

(56) References Cited

U.S. PATENT DOCUMENTS

| | | |
|---|---|---|
| 7,102,355 B1 | 9/2006 | Kumar |
| 7,498,819 B2 | 3/2009 | Kumar |
| 7,751,993 B2 | 7/2010 | Mirafzal |
| 8,319,466 B2 | 11/2012 | Valdez et al. |
| 8,478,552 B2 | 7/2013 | Morita et al. |
| 2009/0154034 A1* | 6/2009 | Tallam ............... H02H 9/06 361/56 |
| 2010/0259099 A1* | 10/2010 | Vedula ............... H02P 29/00 307/9.1 |
| 2011/0153234 A1 | 6/2011 | Winterhalter et al. |
| 2011/0175619 A1 | 7/2011 | Bauer et al. |
| 2012/0086458 A1 | 4/2012 | Wei et al. |
| 2012/0112757 A1 | 5/2012 | Vrankovic et al. |
| 2012/0249038 A1 | 10/2012 | Wei et al. |
| 2013/0218491 A1 | 8/2013 | Wei et al. |
| 2015/0097571 A1* | 4/2015 | Wei ............... G01R 31/088 324/531 |

* cited by examiner

APPARATUS AND METHOD FOR AUTOMATIC GROUND FAULT LOCATION DETERMINATION IN HIGH RESISTANCE GROUNDED MOTOR DRIVE SYSTEM

BACKGROUND INFORMATION

The subject matter disclosed herein relates to power conversion, and more specifically to apparatus and techniques for locating ground faults.

BRIEF DESCRIPTION

One or more aspects of the present disclosure are now summarized to facilitate a basic understanding of the disclosure, wherein this summary is not an extensive overview of the disclosure, and is intended neither to identify certain elements of the disclosure, nor to delineate the scope thereof. Rather, the primary purpose of this summary is to present various concepts of the disclosure in a simplified form prior to the more detailed description that is presented hereinafter.

A method and computer-readable medium are disclosed for identifying a suspected ground fault location in a multi-drive system, including determining whether an operating frequency of a given drive is at or near a fault frequency corresponding to a detected ground fault condition, and selectively identifying the given drive as a suspected ground fault location if the operating frequency of the given drive is within the predefined range including the fault frequency.

A ground fault location system is disclosed, including at least one processor programmed to determine whether an operating frequency of a given drive is within a range including a fault frequency corresponding to a detected ground fault condition in the system while the given drive is operating, and to selectively identify the given drive as a suspected ground fault location if the operating frequency of the given drive is within the predefined range including the fault frequency.

BRIEF DESCRIPTION OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings, in which.

DETAILED DESCRIPTION

Figure 1:
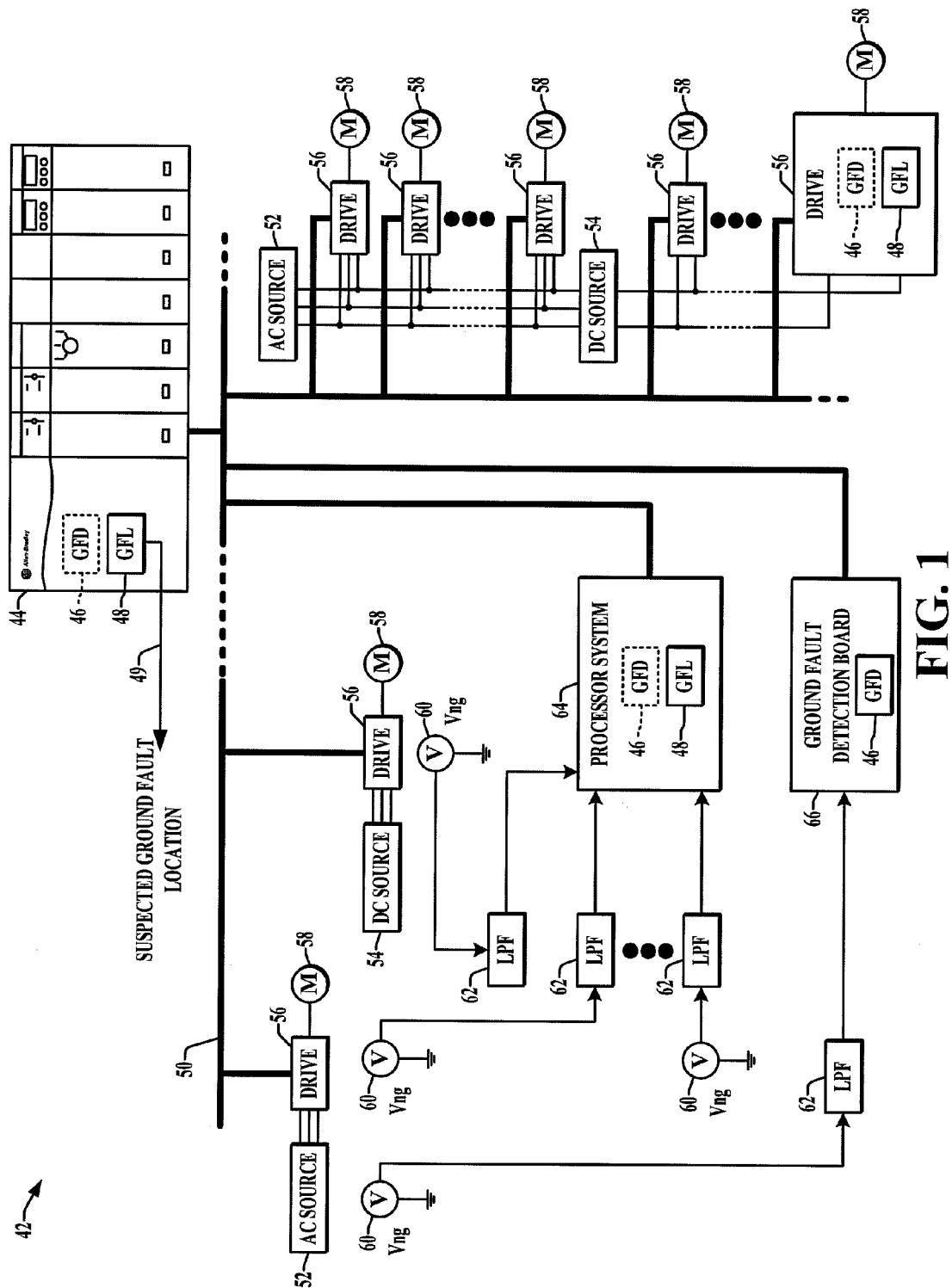
FIG. 1 is a system diagram illustrating a networked multi-drive system with a programmable logic controller connected to a plurality of motor drives via a network for driving multiple motor loads with local and centralized ground fault location systems for identifying ground fault locations in the system according to one embodiment.

Multi-drive systems are employed in a variety of automated industrial applications in which two or more motor drives are operated via a distributed power system, typically using power derived from a shared AC or DC power source. High resistance grounding (HRG) is often employed in such power distribution configurations to allow system components to continue operation during ground fault conditions, with high grounding impedances being used to limit the amount of ground fault current to allow continued safe system operation as well as to facilitate detection of ground faults. When a ground fault situation is detected, however, it may be difficult to identify the source of the fault condition, particularly where many motor drives are connected to a single power source. In a typical situation, service personnel must shut down or deactivate all the drives on a shared DC bus or shared AC connection, and repeatedly test individual drives in a lengthy process of elimination to determine which drive has a grounding problem. At each drive, a ground current measurement must be taken while the drive is running, which prevents usage of that drive and the other deactivated drives during the troubleshooting procedure, and also requires operation of the connected motor for ground fault testing, which may be disadvantageous in certain manufacturing situations. Manual techniques for locating the source of ground faults are thus time-consuming and costly in terms of system downtime as well as labor costs for service personnel.

Referring initially to FIGS. 1-4, several embodiments or implementations are hereinafter described in conjunction with the drawings, wherein like reference numerals are used to refer to like elements throughout, and wherein the various features are not necessarily drawn to scale. The present disclosure provides apparatus and methods for automatically identifying one or more suspected ground fault locations in multi-drive systems by which one or more shortcomings of manual techniques may be avoided or mitigated. Certain embodiments provide for self-diagnosis by motor drives 56 including integrated ground fault detection (GFD) circuitry 46 as well as implementing ground fault location (GFL) systems 48, with the drives 56 determining whether a high resistance ground (HRG) fault has occurred, and if so assessing whether the drive operating frequency (Fdrive) is at or near a fault frequency corresponding to the detected ground fault condition in the system 42. A drive 56 and/or another device of the system 42 (e.g., a programmable logic controller (PLC) 44, a standalone processor-based ground fault detection board or system 64, etc.) may be equipped with ground fault detection and/or ground fault location systems 46, 48, and may implement on-line system diagnosis by identifying a set or list of drives 56 suspected of being the location of a detected ground fault based on proximity of the drive operating frequency to the fault frequency, and may selectively confirm or exonerate individual drives 56 as being a fault location by individually adjusting operating frequencies of the drives 56 and detecting whether the fault frequency changes in response, while allowing the other drives in the system 42 to continue operation.

Figure 2:
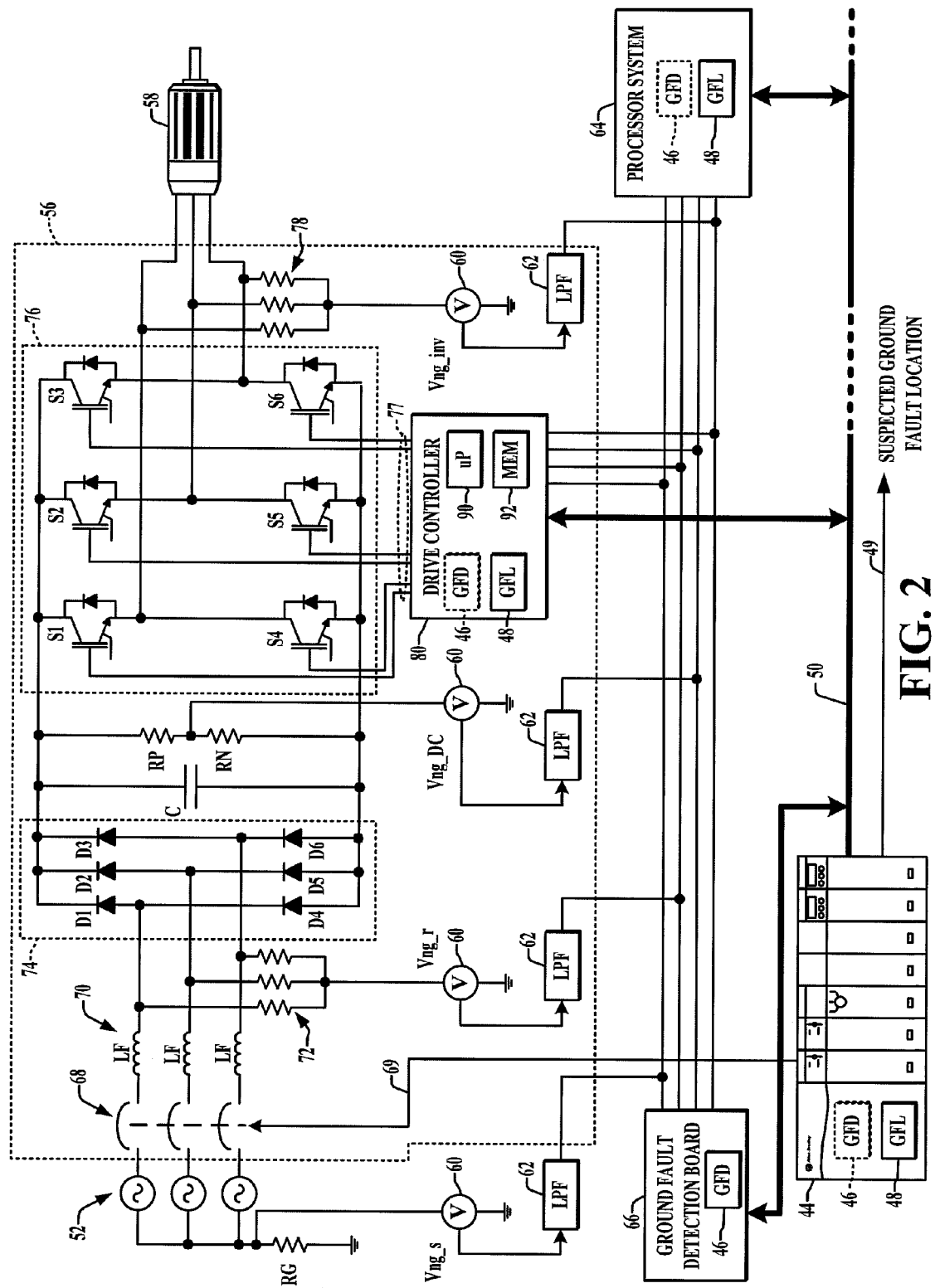
FIG. 2 is a schematic diagram illustrating an exemplary motor drive in the multi-drive system of FIG. 1 according to one embodiment.
Figure 4:
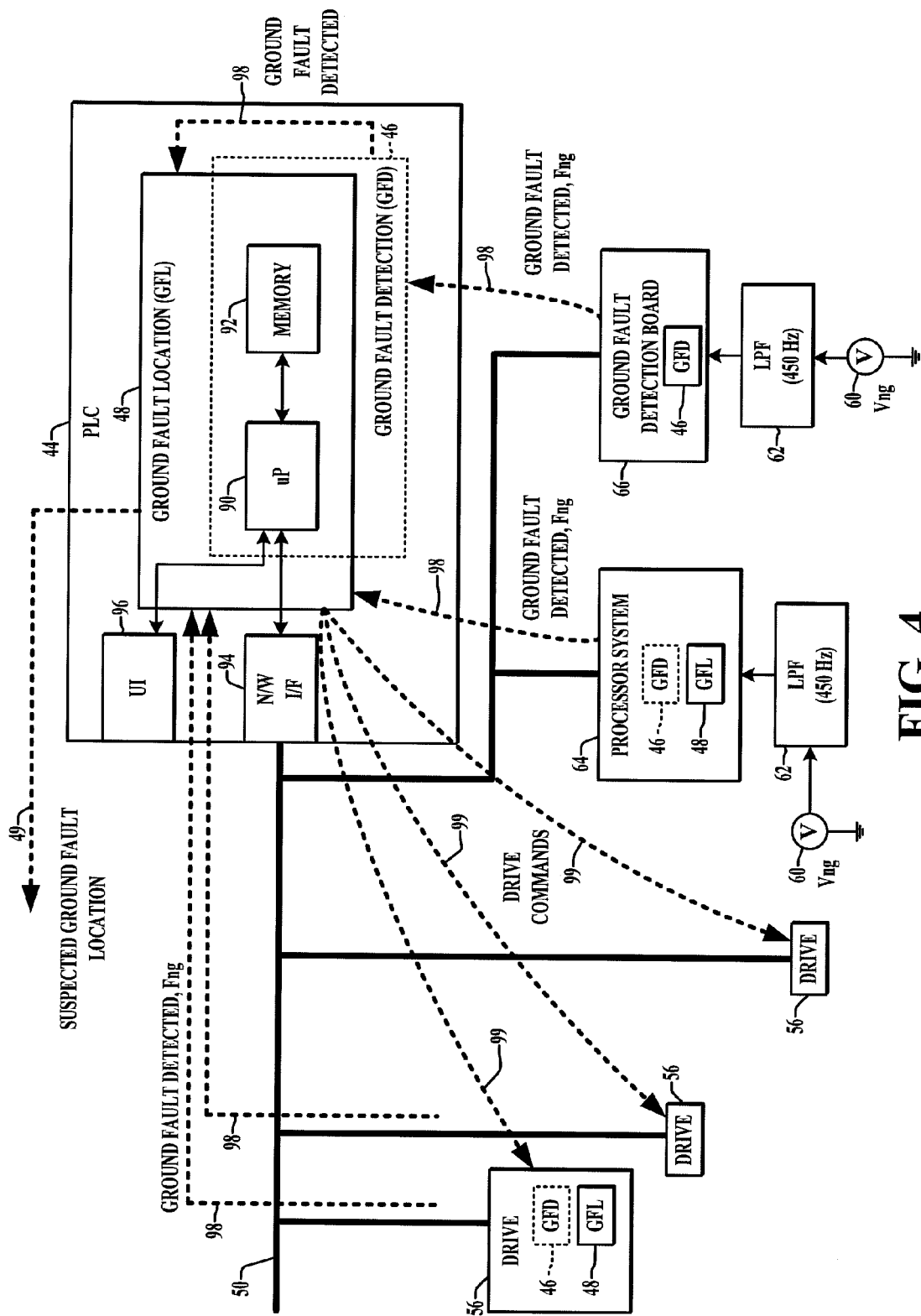
FIG. 4 is a schematic diagram illustrating an exemplary programmable controller implementing a ground fault location system in one embodiment.

Certain disclosed embodiments provide methods and apparatus for automatic ground fault location determination, which may be employed in a variety of distributed multi-drive environments. The various concepts of the present disclosure, moreover, can be implemented in a motor drive 56, in an industrial controller such as a PLC 44 or other processor-based control apparatus 64 to implement a ground fault location system 48 by way of any suitable hardware, processor-executed software, processor-executed firmware, programmable logic, analog circuitry, etc. which provides the described functionality as set forth herein, and may be operative using one or more processor elements executing computer executable instructions stored in an electronic memory of the system. FIG. 4 illustrates an exemplary microprocessor 90 of a PLC controller 44 having electronic memory 92 and a network interface 94 along with a user interface 96 that can be used in one possible implementation. Any suitable memory 92 can be used, such as a computer memory, a memory within a PLC 44 or power converter control system (e.g., drive controller 80 having a microprocessor 90 and a memory 92 as seen in FIG. 2), a CD-ROM, floppy disk, flash drive, database, server, computer, etc. which has computer executable instructions for performing the ground fault location functionality described herein.

The GFL system 48, moreover, may include one or more components, which may be implemented as software and/or firmware components in execution, programmable logic, etc., which is/are operatively, communicatively, coupled with a network 50 for interaction and messaging exchanges with motor drives 56, PLC 44, processor systems 64 and other network interface devices 66 that are also connected to the network 50. In this regard, any suitable networking technology 50 can be used for operatively interconnecting the system components 44, 56, 64, 66, etc., including without limitation Ethernet networks, wired and/or wireless networks, general purpose industrial networks such as ControlNet, industrial Ethernet networks such as Ethernet/IP, etc., fieldbus networks, such as PointIO (PointBus) used for communicating with I/O modules connected to a backplane bus, or the like or combinations thereof. In one non-limiting example, for instance, the GFL system 48 can be implemented in a ControlLogix® PLC controller 44 or other suitable controller and/or in a motor drive 56 such as those provided by Rockwell Automation, Inc.

Figure 7:
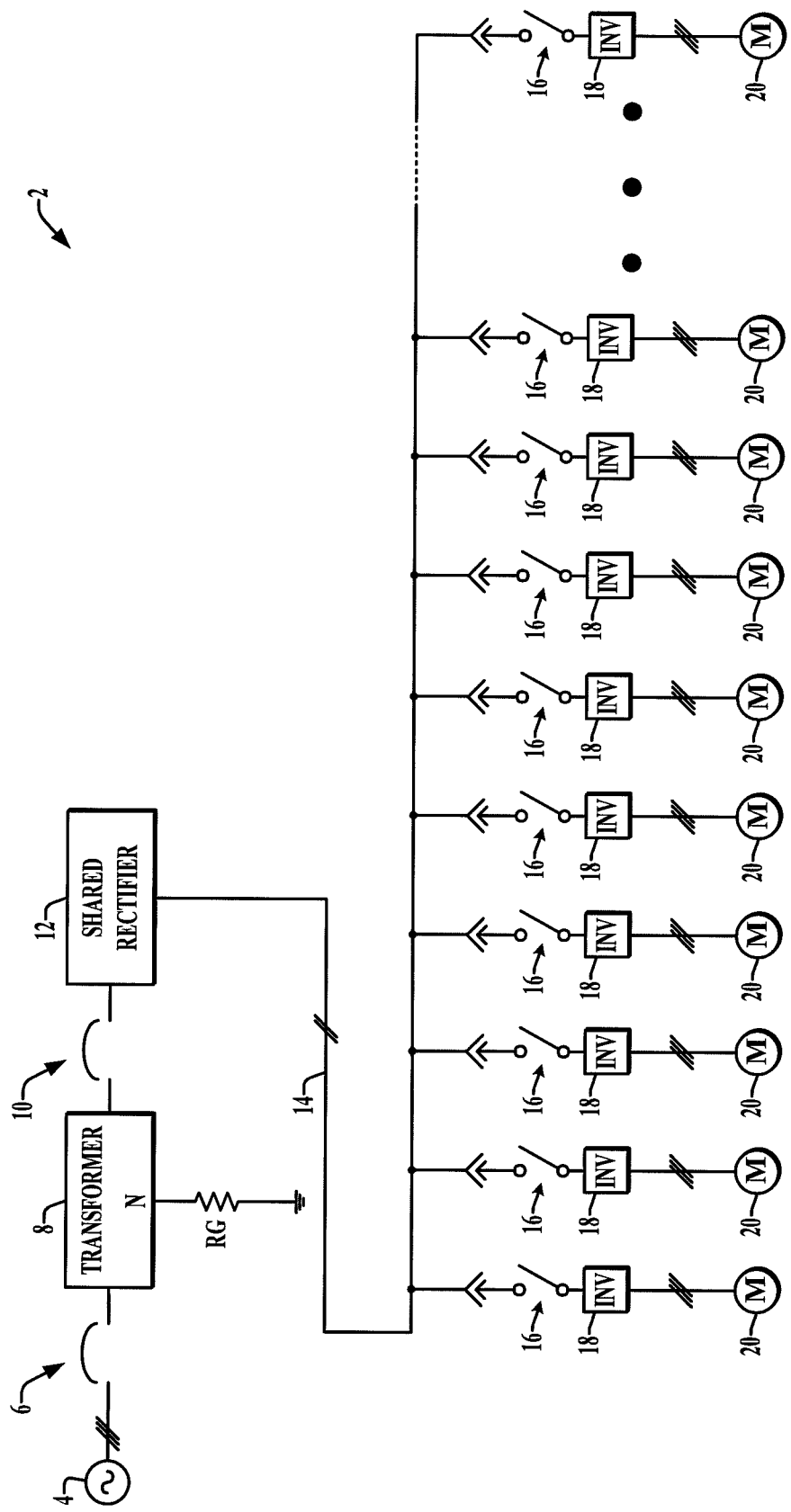
FIG. 7 is a system diagram illustrating an exemplary shared DC bus multi-drive system.
Figure 8:
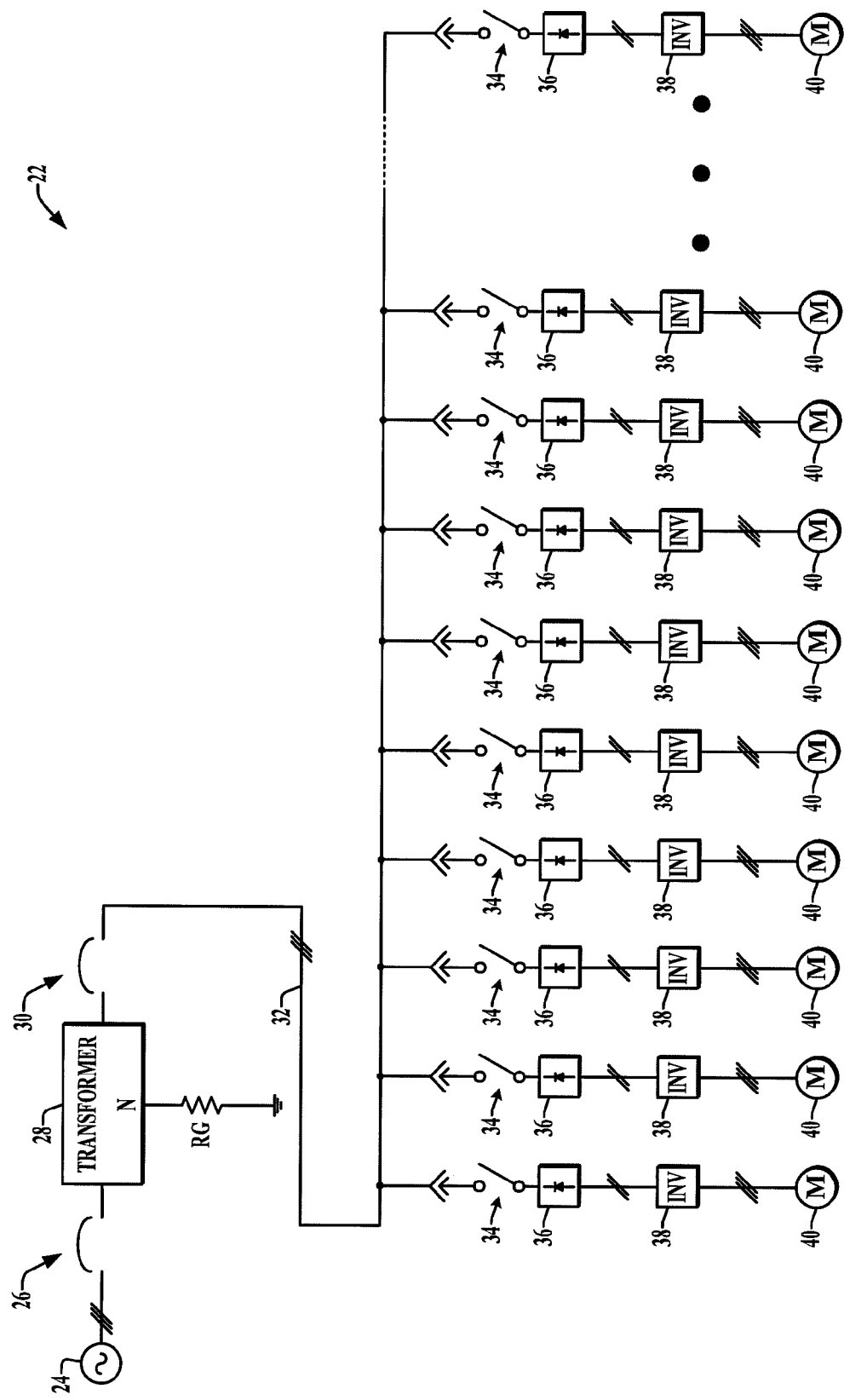
FIG. 8 is a system diagram illustrating an exemplary shared AC bus multi-drive system.

As also seen in FIGS. 7 and 8, the methods and controllers of the present disclosure can be used in connection with a variety of different multi-drive system configurations. FIG. 7 illustrates a shared DC bus multi-drive system 2 in which a three-phase AC input source 4 is connected to a transformer 8 by a three-phase switch or breaker 6, with a high resistance grounding resistor RG connecting the transformer secondary neutral "N" to ground using known high resistance grounding techniques, such as a resistor to limit ground fault current to about 1-10 A, thereby allowing the system to operate even if one or more ground fault conditions occur in the system 2. The secondary of the transformer 8 is connected through a three-phase breaker 10 to the input of a shared or common rectifier 12 which provides a common DC output bus 14 to drive a number of inverters 18. Each of the drives in this case includes an inverter 18 providing a three-phase variable frequency, variable amplitude AC output to drive a connected AC motor load 20, and each drive also includes a local power disconnect switch 16 to disconnect the inverter input from the shared DC bus 14. FIG. 8 shows a shared AC system 22 in which an AC input 24 provides three-phase AC power via a breaker 26 to a transformer 28 whose secondary neutral is grounded via a resistor RG, and whose output provides a shared three-phase AC bus 32 with a system breaker 30 optionally provided at the output of the transformer secondary. In this case, multiple drives are connected to the shared AC bus 32, and individually include a local drive disconnect switch 34 connected between the shared AC bus 32 and a local rectifier stage 36. The rectifier 36 provides a DC bus as an input to a local inverter 38, which in turn provides a three-phase output to drive a connected AC motor load 40 as shown. Ground faults may occur at various points within the systems 2, 22 in FIGS. 7 and 8. For instance, a ground fault can occur at the transformer 8 in FIG. 7 or at the secondary of the transformer 28 in FIG. 8. Alternatively or in combination, a ground fault could occur on the motor side of the drive inverters 18, 38 in either system 2, 22. Furthermore, ground fault conditions are possible at the DC-side of the motor drives, including along the shared DC bus 14 in FIG. 7, or at the local inverter inputs in FIG. 7. Also, DC side faults could occur in the rectifiers 36 of the drives in FIG. 8. As seen in FIGS. 7 and 8, therefore, manually diagnosing a detected ground fault condition in either system 2 or 22 is time-consuming and labor-intensive, particularly where large systems are involved.

Referring again to FIGS. 1-4, the present disclosure advantageously provides automated diagnostic techniques and systems 48 by which the location of one or more ground faults can be easily identified, while advantageously continuing operation of one or more drives at their desired operating points (e.g., speeds or frequencies), preferably within allowed system tolerance limits. Thus, whereas manual high resistance ground fault location identification techniques involve turning off all or many motor drives to individually assess each drive while the other drives are off, the various concepts of the present disclosure advantageously facilitate automated ground fault location functionality without system shutdown. In particular embodiments, for instance, individual motor drives 56 can perform self-diagnosis based on frequency analysis of one or more fault signals, such as a neutral-ground voltage, a high resistance ground current signal, etc. by determining whether the host drive 56 is operating at or near a frequency associated with the detected fault signal (e.g., a neutral-ground voltage signal Vng or an integral INTVng of the neutral-ground voltage Vng having a frequency Fng).

In addition, disclosed ground fault location system embodiments 48 assess operating speed or frequency information from the drives 56 of the system 42 in order to identify a set or list of suspect drives 56 operating at or near the fault frequency Fng, and individually adjust one or more of the operating frequencies Fdrive of the suspected drives 56 one other time while the system 42 continues normal operation, and while the fault frequency Fng is monitored. The GFL system 48 determines whether the fault frequency changes by a threshold amount in response to adjustments or changes to the operating frequency Fdrive of a single selected suspect drive 56, and if so, identifies that drives 56 as the location or source of the detected ground fault condition. Otherwise, that selected drive 56 is exonerated, and the system 48 performs similar operation with respect to other drives 56 in the suspect set. In certain embodiments, moreover, the system 48 may also identify system ground fault locations, such as a shared AC bus and/or a shared DC bus were the fault frequency Fng is at or near a system operating frequency (e.g., the line frequency of an AC source powering the system 42) if all the suspected drives 56 are exonerated by speed adjustment analysis. In this manner, the ground fault location system 48 advantageously facilitates automated identification of the location of a detected high resistance ground fault condition in the system 42 without disrupting system operation, thereby limiting the system downtime and manual effort, particularly compared with manual ground fault location approaches.

FIG. 1 is a schematic diagram illustrating an exemplary multi-drive system 42 including a programmable logic controller or PLC 44 connected to an Ethernet or ControlNet network 50, as well as a plurality of motor drives 56 driving associated AC motor loads 58, where the individual drives 56 in this non-limiting example are each connected to an associated AC source 52 or DC source 54. As shown, moreover, several drives 56 may be powered from a shared AC or DC source 52, 54, and different drives 56 may be powered by separate sources 52, 54 in a variety of different technologies or configurations, wherein the various concepts of the present disclosure are not limited to any particular power distribution architecture. As seen in FIG. 1, moreover, the PLC 44 in this embodiment includes a ground fault detection system 46 operative to detect the presence or absence of a high resistance ground fault condition within the system 42, as well as a ground fault location system 48 implemented using a processor 90 (FIG. 4) of the PLC 44 for automated ground fault location identification as described further herein. Moreover, one or more of the drives 56 may likewise be configured with a ground fault detection system 46 and/or a ground fault location system 48. Furthermore, as seen in FIG. 1, a dedicated ground fault detection board 66 may be provided in the system 42 for monitoring one or more signals (e.g., a neutral-ground voltage Vng associated with the AC source 52 in the example of FIG. 1) for determining or detecting the presence or absence of a high resistance ground fault condition in the system 42. Also, a dedicated processor system 64 may be provided in the system 42, including a ground fault detection system 46 and/or a ground fault location system 48, wherein the illustrated example provides network connections between the PLC 44, the drives 56, the processor system 64 and the ground fault detection board 66 via the network 50.

As seen in FIG. 1, moreover, various sensors 60 may be disposed at different points within the system 42 to measure one or more neutral-ground voltages indicated in the figures as Vng, and the sensor outputs may be optionally filtered using hardware low pass filters (LPF) 62 suitable for use in detecting the presence of a ground fault. For example, low pass filters 62 in certain embodiments may be configured with cutoff frequencies above normal operating frequencies of the motor drives 56 and above expected line frequencies in the system 42. In other possible embodiments, the low pass filter components or circuits 62 may be omitted, and/or the receiving system 46 may perform one or more filtering operations in hardware, processor-executed firmware, processor-executed software, programmable logic, etc. In the illustrated example, the outputs of the low pass filters 62 can be provided to a processor system 64 that implements a ground fault detection (GFD) system 46, such as through suitable analog to digital (A/D) conversion circuitry and processor-executed programming to generate one or more signals or values or messages for provision to the ground fault location system 48 in the PLC 44, in the drive(s) 56 and/or in the processor system 64, for example, through the network 50 indicating that a ground fault has been detected by one of the sensors 60.

Figure 3:
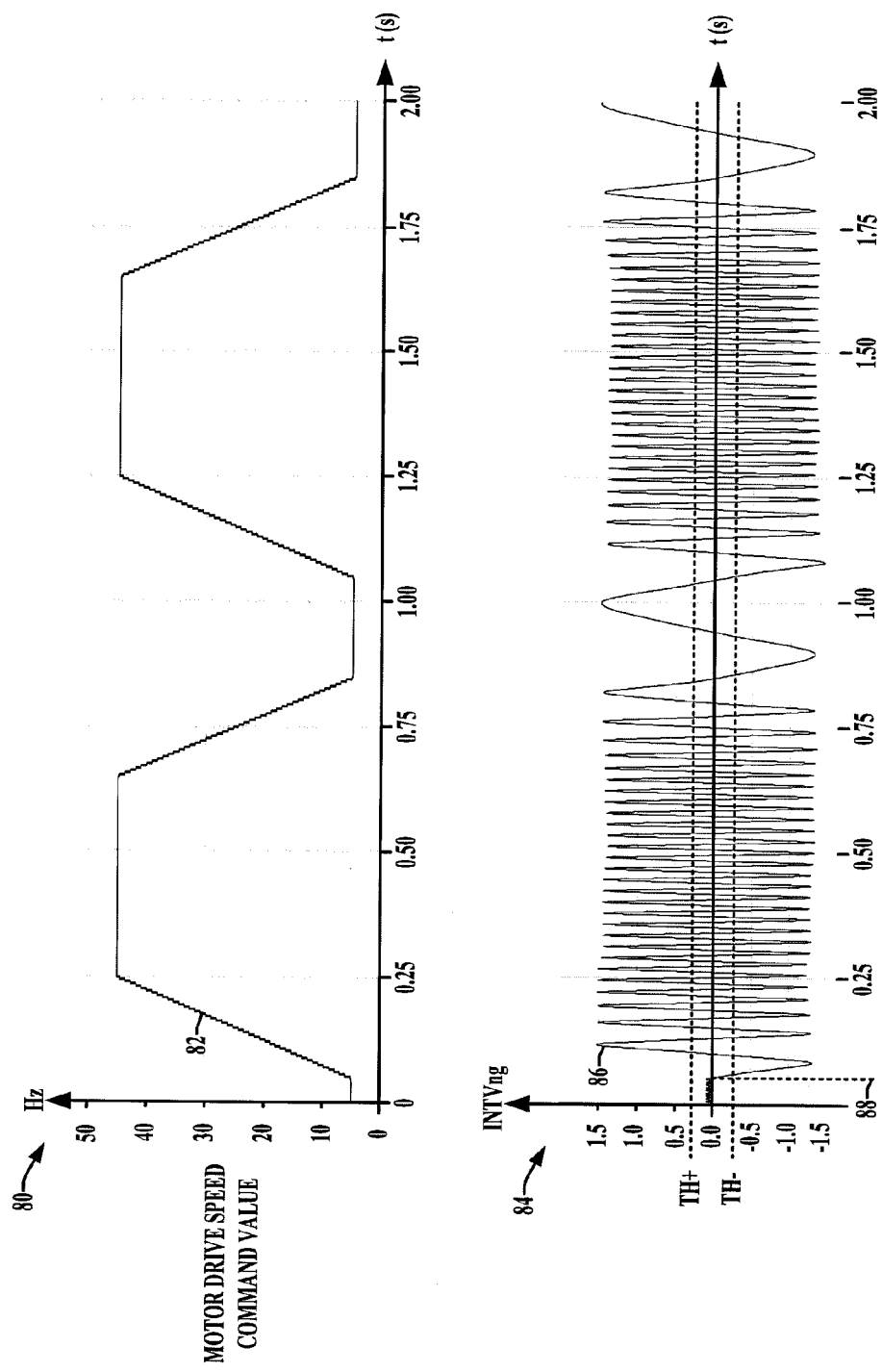
FIG. 3 is a waveform diagram illustrating exemplary ground faulted drive operating frequency and neutral-ground fault integral signal curves in one embodiment.

FIG. 3 illustrates a waveform diagram showing a graph 80 illustrating a motor drive speed command value 82 as a function of time, as well as a graph 84 illustrating an exemplary curve 86 showing an integral INTNvg of a neutral-ground voltage Vng measured by one of the sensors 60 in the system 42. In one possible implementation, a ground fault detection system 46 generates an integral signal INTVng or otherwise computes the integral and compares the amplitude of such a neutral-ground voltage integral signal 86 with a positive and negative threshold range TH+, TH−. The system 46 detects or identifies a high resistance ground fault condition in the system 42 if the measured neutral-ground voltage integral signal 86 is outside the range defined by these thresholds (e.g., no fault detection where TH−≤INTVng≤TH+), and otherwise a fault is detected if the neutral-ground voltage integral signal amplitude is greater than or equal to a threshold value. Moreover, one or more of the motor drives 56 may internally provide one or more sensors 60 for measuring neutral-ground voltages or other operating parameters and generating suitable ground fault detection signals or messages for provision to the controller 44 or other ground fault location system 48 via the network 50 indicating detection of ground faults at or proximate the corresponding motor drive 56 as well as a determined fault frequency.

In addition, the ground fault detection systems 46 in certain embodiments also analyze the corresponding neutral-ground signal Vng (and/or its integral INTVng) with respect to frequency content, for example, using zero crossing detection circuitry, phase locked loops, or other suitable frequency determination means, and provide the ground fault location system 48 with a fault frequency Fng by way of a signal or value corresponding to a detected ground fault condition in the system 42. Moreover, as seen in FIG. 1, the PLC 44 may also implement a ground fault detection system 46, for internally generating flags, or values, or other status indicators indicating that a fault has been detected based on received messaging indicating a value of one of the neutral-ground voltages Vng (and/or its integral INTVng) from the sensors 60 that indicates a ground fault has occurred. For instance, the ground fault detection board 66 may include A/D converter and network interface components and may be configured to receive the output of one or more of the low pass filter 60 and provide one or more network messages to the controller 44 (or to any other ground fault location system 48) through the network 50 indicating the value of the received signal, by which the ground fault detection system 46 of the PLC controller 44 may ascertain whether the received value (and/or its integral INTVng) is indicative of the presence of a ground fault condition in the system 42.

FIG. 2 is a schematic diagram illustrating further details of an exemplary motor drive 56 embodiment in the system 42, which receives AC input power through a local drive disconnect switch 68 from an AC source 52. The drive 56 in this example includes input filter inductors LF 70, and a passive rectifier 74 including diodes D1-D6 providing a DC bus voltage across a bus capacitor C. The DC bus voltage is provided as an input to an inverter stage 76 including active switching devices S1-S6 operated according to switching control signals 77 from a drive controller 80. In addition, the PLC 44 in this example provides a control signal 69 to operate the local drive disconnect switch 68 or this could be operated manually, with the PLC 44 optionally automatically prompting such manual operation. The drive controller 80 can be any suitable hardware, processor-executed software, processor-executed firmware, programmable logic, analog circuitry, etc. which provides the described functionality as set forth herein, and may be operative using one or more processor elements 90 executing computer executable instructions stored in an electronic memory 92 of the drive 56, for implementing ground fault detection system 46 and optionally a ground fault location system 48 as described herein. In other embodiments, an active front end rectifier 74 may be used, for example, to implement active front end control for power factor correction and/or for regenerative drive operation according to suitable rectifier switching control signals (not shown) from the drive controller 80. Moreover, alternate embodiments are possible using a current source rectifier 74 and a current source inverter 76, and which include one or more DC link chokes with the capacitor C being omitted. The inverter stage 76 provides an AC output having controlled frequency and amplitude in order to drive a motor or other load 58 according to the switching control signals 77.

The ground fault location system 48, whether implemented in the drive controller 80, the PLC 44, or in another network device (e.g., processor system 64 in FIG. 1) is operatively connected to the network 50 in order to exchange control commands, data and other information with the PLC 44, drives 56 and other devices on the network 50. As seen in FIG. 2, the drive controller 80 is operative to receive commands from the PLC 44 and to alter the operation of the drive 56 accordingly, including provision of the inverter switching control signals 77 and/or control of the operational state of the local drive disconnect switch 68 via the control signal 69. In this regard, the drive controllers 80 in the illustrated drives 56 of the system 42 in FIG. 1 are operative to receive local drive speed commands or operating frequency commands and to control operation of the corresponding inverter 76 in order to drive the motor load 58 at a corresponding frequency (Fdrive), and the drives 56 also report their operating frequencies Fdrive to the PLC 44 either in a regular unsolicited fashion, or in response to request messages from the PLC 44. In this manner, the PLC 44 or a drive 56 or another processor system 64 can implement a ground fault location system 48 which sends various network messages to particular drive controllers 80 (directly or indirectly) to selectively adjust individual motor drives 56 by requesting individual drives 56 to operate at a designated drive frequency Fdrive thereby facilitating intelligent ground fault location operations as described herein to identify suspected ground fault locations within a multi-drive system 42. Non-limiting examples include the capability of the PLC 44 to send one or more network messages to cause local drive controllers 80 to operate the inverter switches S1-S6 to rotate the motor load 58 according to a given frequency command (speed command). The illustrated drive controller 80 is further programmed to implement various motor control functions associated with operation of the motor drive 56 as are known. In certain implementations, moreover, where a ground fault location system 48 is implemented in a local drive 56 or in a stand-alone processor system 64, the operating GFL system 48 may provide individual drive frequency commands directly to a selected drive 56 via the network 50, or may provide such to the PLC 44, which in turn, provides the drive frequency commands to the selected drives 56 via the network 50.

As seen in FIG. 2, sensor apparatus 60 may be provided at various locations to measure neutral-ground or other voltages or operating parameters associated with operations of the drives 56 as well as other locations within a multi-drive system 42. In particular embodiments, neutral-ground signals are measured via the sensors 60, such as a neutral-ground voltage Vng as illustrated. Other implementations are possible using different neutral-ground measured signals, including without limitation neutral-ground current signals, etc. In addition, one or more such signals may be measured and used and integrated for detecting the presence and frequency of a high resistance ground fault within the system 42. As illustrated in FIG. 2, for example, a sensor 60 is operatively connected to measure a neutral-ground voltage Vng_s associated with the AC source 52, such as the voltage across a grounding resistor RG in one example, and provides a sensor signal as an input to an optional low pass filter 62. The filter output provides an input to a standalone ground fault detection board 66 including an A/D, a processor and a network interface, which in turn implements a ground fault detection system 46 that provides a value to the PLC 44 through the network 50 indicating whether an integral of the measured intra-ground voltage signal exceeds a threshold, e.g., as shown in the graph 84 of FIG. 3. In this case, there is initially no-fault until the time 88, after which the neutral-ground voltage integral signal 86 INTVng exceeds one or both of the thresholds TH+, TH−.

The ground fault detection systems 46 in certain embodiments perform integration and the threshold comparison to determine the presence of a ground fault condition in the system 42 by any suitable means, including without limitation hardware comparator circuitry, A/D conversion with software-implemented threshold comparison functions, etc. In addition, the ground fault detection systems 46 also implement frequency detection functionality, for example, using zero-crossing circuitry or processor-implemented functions, phase locked loops, etc., and also provide a fault frequency signal or value (Fng) indicating the frequency of the neutral-ground voltage signal Vng (or of its integral INTVng) to one or more ground fault location systems 48 via the network 50. In this manner, the ground fault location system(s) 48 are provided with indications of whether or not a ground fault condition exists in the system 42, as well as a fault frequency (Fng) corresponding to a detected ground fault condition in the system 42.

As further seen in the example of FIG. 2, line-neutral sense resistors 72 are connected from the rectifier input terminals between the filter inductors 70 and the rectifier 74 with the rectifier neutral voltage Vng_r being measured by another sensor 60 that provides a signal to the A/D and network interface component 66 through another low pass filter 62. In this example, moreover, positive and negative DC bus sense resistors RP and RN are connected in series with one another across the DC bus in parallel with the capacitor C, and are of substantially equal impedance values to provide a DC mid-point voltage (e.g., neutral-ground voltage) Vng_DC sensed by a corresponding sensor 60 and associated low pass filter 62. The example of FIG. 2 also includes output neutral voltage sense resistor 78 connected as shown to allow measurement by a sensor 60 of an inverter neutral-ground voltage Vng_inv. Also or separately, sensors 60 and/or the low pass filters 62 shown in FIG. 2 may be integrated into a motor drive 56 or may be separate components.

Where provided, moreover, a separate ground fault detection board 66 may receive analog signals directly from the sensor 60 and/or from any provided intervening low pass filters 62, and may provide corresponding digital values indicating detection of a ground fault and corresponding fault frequency Fng to the PLC 44 accordingly. In the illustrated example, the PLC 44 may also implement a ground fault detection system 46 which determines whether a ground fault condition is suspected based on one of the received values according to any suitable ground fault identification or ground fault detection technique or algorithm, and the PLC-implemented ground fault detection system 46 may also receive a series of measured fault signal values (Vng) and determine a corresponding fault frequency in certain embodiments. As further shown FIG. 2, moreover, the processor system 64 may receive the analog measured signals directly from the sensors 60 and/or from associated low pass filters 62, and may implement an on-board ground fault detection system 46, with the processor system 64 providing ground fault detection indications and a corresponding fault frequency to a ground fault location system 48 in the PLC 44, in a drive 56, or elsewhere in the system 42, via the network 50. Furthermore, a ground fault detection system 46 may also be implemented by the drive controller 80, with the controller 80 receiving signals from the sensors 60 and/or from any associated low pass filters 62 and providing network messaging including indications of detected ground fault conditions through the network 50 to the PLC 44.

FIG. 3 illustrates motor drive frequency (speed command value) and neutral-ground voltage integral waveform diagrams 80 and 84, respectively, in one embodiment. The inventors have appreciated that high resistance ground fault conditions in a multi-drive system 42 may be indicated by a signal waveform amplitude, and the source of such a detected fault can be automatically identified based at least partially on an AC frequency associated with such a signal. In the illustrated implementations, a neutral-ground signal waveform (e.g., voltage Vng, neutral-ground current signal, etc.) is used and integrated, but other electrical signals may be monitored and assessed in order to determine the presence of a ground-fault condition, and such signals may be used which have an associated frequency at least partially indicative of a fault source. In the present disclosure, this relationship is used by the ground fault location system 48 for selectively identifying individual drives 56 as suspected sources of detected ground faults in the system 42. As seen in the graph 84 of FIG. 3, for instance, the neutral-ground voltage integral signal 86 initially has a very low signal amplitude, and a ground-fault condition occurs in a particular associated motor drive 56 at time 88, whereupon the amplitude of the waveform 86 increases significantly (e.g., beyond a threshold range defined by the illustrated thresholds TH+, TH−. During the subsequent fault condition time period, moreover, oscillations in the integral signal 86 occur at a frequency generally dependent upon the operating speed (frequency Fdrive) of the associated motor drive 56. In this regard, FIG. 3 illustrates a graph 80 showing a commanded motor drive speed 82 increasing from approximately 5 Hz up to approximately 45 Hz at 0.25 seconds, and then decreasing back to around 5 Hz at 0.80 seconds, and undergoing a subsequent ramp up and ramp down cycle as shown. The frequency of the neutral-ground voltage integral signal waveform 86 likewise increases and decreases generally proportional to the motor drive speed command value 82. The illustrated ground fault location systems 48 advantageously utilize this relationship in selectively identifying a suspected ground fault location in the multi-drive system 42.

Operation of the ground fault location system 48 is illustrated and described hereinafter in connection with FIGS. 1-6, using the example of a PLC-implemented ground fault location system 48 receiving input information from one or more ground fault detection systems 46 in the system 42. Similar operation may be implemented in a motor drive-based around fault location system 48 and/or in a separately implemented ground fault location system 48 (e.g., in the processor system 64 separate from any PLC or motor drive).

Figure 5:
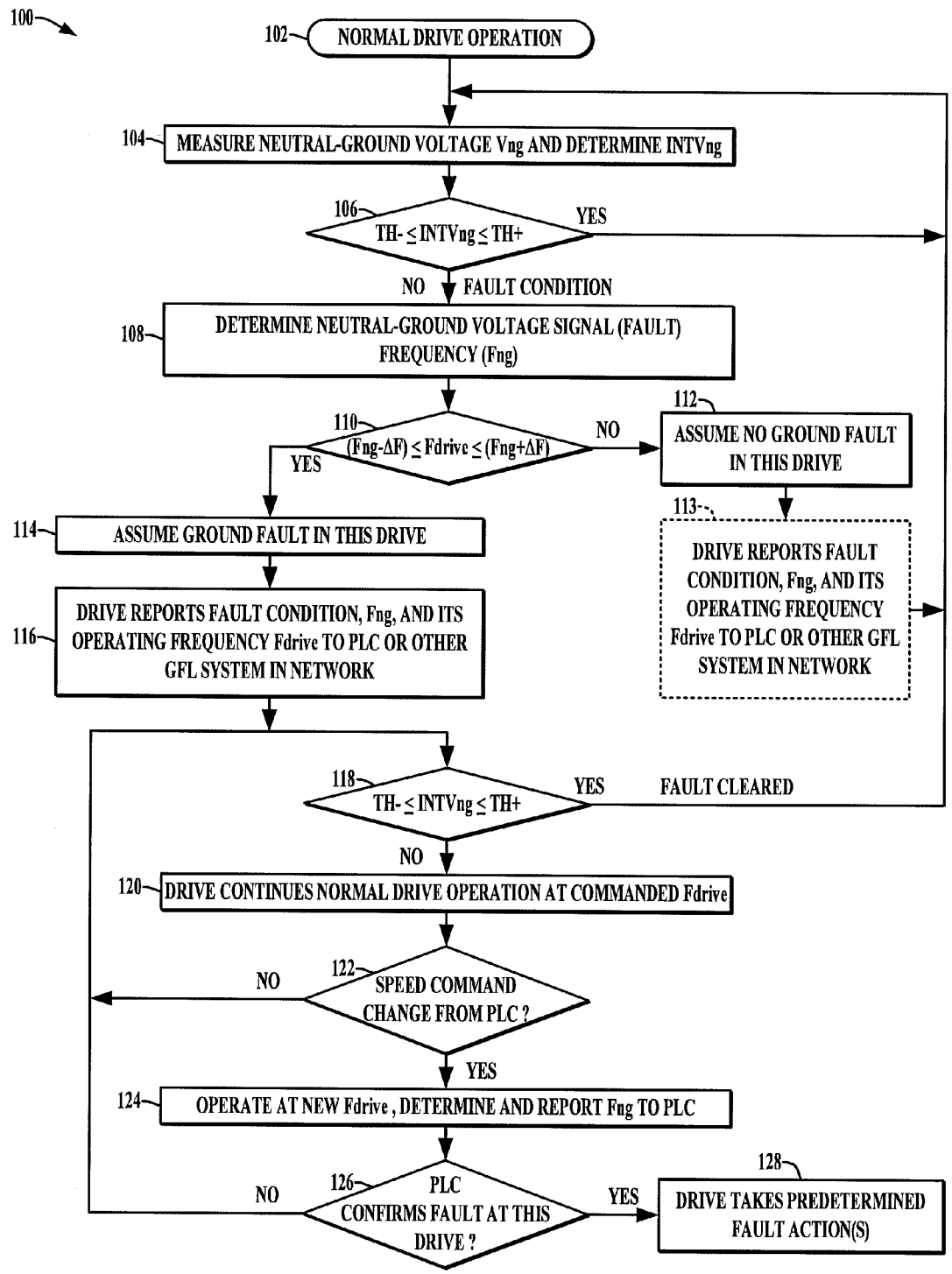
FIG. 5 is a flow diagram illustrating an exemplary method for ground fault location self-diagnosis in a motor drive in one embodiment.
Figure 6:
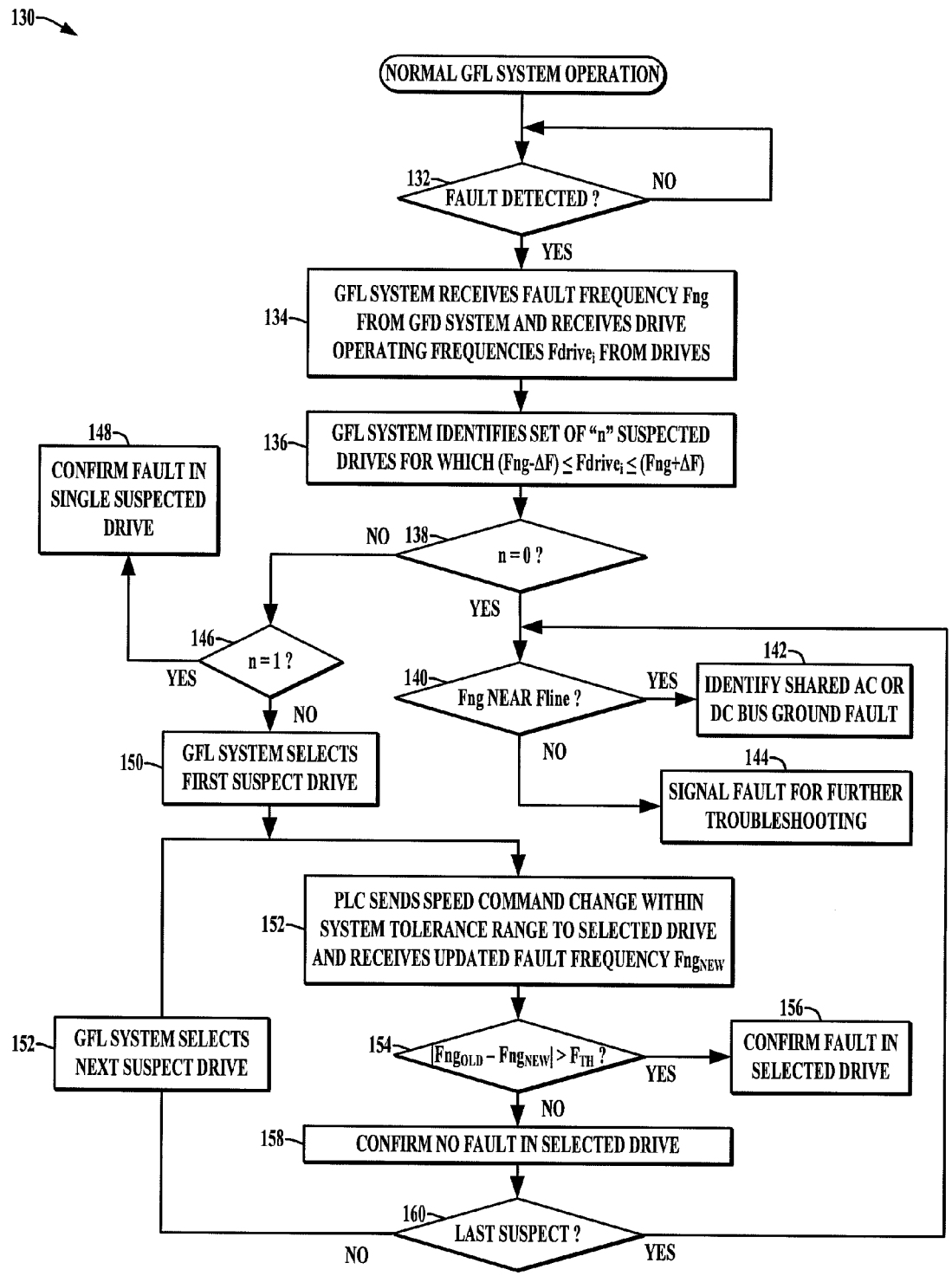
FIG. 6 is a flow diagram illustrating an exemplary method for ground fault location through suspect identification and selective frequency adjustment for drive exoneration or fault location confirmation in one embodiment.

FIG. 5 is a flow diagram illustrating an exemplary process 100 for operation of a motor drive 56, in which a ground fault detection system 46 and ground fault location system 48 of the drive 56 perform ground fault location self-diagnosis. In addition, a flow diagram in FIG. 6 depicts an exemplary method 130 for ground fault location through suspect identification and selective frequency adjustment for drive exoneration or fault location confirmation in one PLC-implemented GFL system embodiment 48. As seen in FIGS. 2 and 4, the ground fault location system 48 provides an output 49, such as a network message or other signal or value, indicating one or more suspected ground fault locations in the system 42 according to received ground fault detection and fault frequency indications 98 from the various ground fault detection systems 46. In this regard, the ground fault detection and frequency indications 98 may be any suitable form of analog signal, digital message, etc. in various embodiments. In one possible example, the indications 98 are one or more messages sent through the network 50 indicating (1) that a ground fault condition exists, and (2) a corresponding ground fault signal frequency (e.g., Fng).

The PLC 44 in one embodiment includes a processor 90 and associated electronic memory 92, with the processor 90 being operatively coupled with the memory 92 as well as a network interface component 94 and a user interface component 96. The PLC 44 may be any suitable type of industrial control apparatus, such as a rack-mounted system including one or more modules connected to a common backplane bus for connection of I/O and networks, including an industrial network 50, for example, ControlNet. As seen in FIG. 4, the ground fault location system 48 is configured by suitable programming instructions in the PLC 44 (e.g., stored as program instructions in the memory 92 in one example), by which the GFL system 48 sends drive commands 99 in certain cases including adjusted drive speed or frequency commands to one or more of the networked motor drives 56, and receives ground fault detection and fault frequency indications 98 from one or more of the drive 56 and/or from a separate processor system 64 implementing a ground fault detection system 46, from a separate ground fault detection board 66, and/or from a ground fault detection system 46 implemented in the PLC 44 to internally provide detection indications 98 based on received ground-neutral voltage messages (e.g., from the A/D and network interface component 66 as described above).

The processes 100 and 130 of FIGS. 5 and 6 are illustrated and described below in the form of a series of acts or events, although the various methods of the disclosure are not limited by the illustrated ordering of such acts or events. In this regard, except as specifically provided hereinafter, some acts or events may occur in different order and/or concurrently with other acts or events apart from those illustrated and described herein in accordance with the disclosure. In addition, not all illustrated steps may be required to implement a process or method in accordance with the present disclosure, and one or more such acts may be combined. The illustrated methods 100, 130 and other methods of the disclosure may be implemented in hardware, processor-executed software, processor-executed firmware, programmable logic, or combinations thereof, such as in the GFL system 48 in the drives 56, the PLC 44, the processor system 64 or in another processor-implemented device in the system 42, and may be embodied in the form of computer executable instructions stored in a tangible, non-transitory computer readable medium, such as in the electronic memory 92 operatively associated with the processor 90 in the example of FIG. 4. Moreover, although illustrated as being implemented in the PLC 44 and/or in the drive 56, any suitable processor-based system may be used to implement the GFL system 48 for drive self-diagnosis on an individual drive basis and/or for identifying the location of a ground fault in a system 42 having multiple suspected locations. In this regard, the GFL system 48 may be implemented in any suitable processor-equipped system having suitable interconnections to provide commands 99, directly or indirectly, to a plurality of motor drive 56 and which can receive ground fault detection and fault frequency indications 98, directly or indirectly, from various sources, wherein the various concepts of the present disclosure are not limited to implementation in a programmable logic controller, motor drive controller, or in any specific host system.

The motor drive operation in the flow diagram 100 of FIG. 5 begins with normal drive operation at 102, with the drive measuring for otherwise obtaining or receiving a neutral-ground signal such as a measured neutral-ground voltage signal or value Vng at 104. The GFD system 46 in the drive 56 determines an integral INTVng of the neutral-ground voltage Vng and determines at 106 whether the neutral-ground voltage integral INTVng is within a predefined acceptable range (e.g., TH−≤INTVng≤TH+ as shown in FIG. 3 above). If so (YES at 106), the process continues at 104 and 106. Otherwise (NO at 106), the ground fault detection system 46 of the motor drive 56 determines that a fault condition exists in the system 42, and determines a neutral-ground voltage signal frequency (fault frequency Fng) at 108. Any suitable frequency determination techniques may be employed at 108, including without limitation use of zero crossing detectors, PLLs, firmware algorithms, etc. In certain embodiments, the system 46 determines the fault frequency Fng as a frequency of the integral INTVng at 108.

A determination is made at 110 in FIG. 5 as to whether the operating frequency Fdrive of the given drive 56 is within the predefined range including the fault frequency Fng (e.g., Fng+/−ΔF, or other range that includes Fng). In this manner, the ground fault location system 48 determines at 110 whether the drive 56 is operating at or near (e.g., substantially at) the fault frequency Fng. In one suitable non-limiting example, for instance, the test range at 110 may be defined in terms of a ΔF value of several Hz (e.g., Fng+/−3 Hz), or as a percentage range around (or at least including) the fault frequency Fng (e.g., Fng+/−2%, between Fng+2% and Fng−1%, etc.). If the drive operating frequency Fdrive is outside the designated range (NO at 110), the drive 56 exonerates itself as a suspected fault location at 112, and may optionally report the existence of the detected fault condition, the determined fault frequency Fng and its operating frequency Fdrive to the PLC 44 or to another GFL system 48 in the system 42 at 113, and the process 100 returns to 104 as described above. However, if the drive frequency Fdrive is at or near the fault frequency Fng (YES at 110), the drive self-diagnoses itself as being the fault source location (or at least a suspect) at 114 and reports the detected fault, the fault frequency Fng and the drive operating frequency Fdrive at 116 to the PLC 44 or other GFL system 48. The drive 56 may report its conclusion of fault location identification at 116, or the receiving GFL system 48 may determine that the sending drive 56 is a suspected fault location based on the reported fault and operating frequencies as described further below.

In the illustrated embodiment, moreover, the drive 56 again assesses the measured neutral-ground voltage at 118, determines the integral INTNng, and determines whether the neutral-ground voltage integral is within the predefined amplitude range (e.g., TH−≤INTVng≤TH+). If so (YES at 118), the fault is deemed cleared, and the process returns to 104. Otherwise (NO at 118), the drive 56 continues normal operation at 120 and determines at 122 whether a speed command change has been requested by the PLC 44. As described further below, the PLC 44 or other GFL system 48 may selectively change or adjust operating speeds (i.e., operating frequencies) of one or more suspected drives 56 in the system 42 by sending a speed command change through network communications in order to identify the ground fault location. If no speed command change is received (NO at 122), the normal operation continues while monitoring the neutral-ground voltage integral signal amplitude at 118 and 120 as previously described. If a speed change is requested (YES at 122), the drive 56 modifies its operating frequency Fdrive, and determines and reports the fault frequency to the PLC 44 (or other GFL system 48) at 124. If the PLC confirms that the drive 56 is the fault location (YES at 126), the drive may perform one or more predetermined actions at 128 (e.g., controlled shutdown, display fault condition on a user interface, etc.), and otherwise (NO at 126) returns to again assess the monitored fault signal amplitude at 118. The drive 56 thus implements local self-diagnosis for assessing whether it is (at least suspected of being) a detected ground fault location within the multi-drive system 42, without interrupting operation of its associated motor and without requiring shutdown of any other drives 56 in the system 42.

FIG. 6 is a flow diagram illustrating an exemplary method 130 for ground fault location through suspect identification and selective frequency adjustment for drive exoneration or fault location confirmation in one embodiment. The method 130 may be implemented in the illustrated ground fault location (GFL) system 48, for example, using a processor of a PLC 44, of a motor drive 56, and/or of a separate processor system 64 in certain embodiments. Beginning from normal operation, the GFL system 48 determines at 132 whether a ground fault has been detected. The GFL system 48 may receive an indication that a ground fault has been detected from an external device via the network 50, for example, from a ground fault detection system 46 located within the multi-drive system 42, or may receive such an indication at 132 from and on-board ground fault detection system 46. If no fault has been detected (NO at 132), normal operation continues, and once a fault has been detected (YES at 132), the GFL system 48 receives or otherwise obtains a fault frequency (e.g., Fng) at 134 from a ground fault detection system 46 (e.g., implemented in a ground fault detection board 66, or in one or more of the drives 56, in the PLC 44, etc.). In addition, the GFL system 48 receives drive operating frequencies (Fdrive$_i$) from one or more of the drives 56 at 134, for example, by automatic reporting messaging through the network 50, or by the GFL system 48 sending request messaging to the operating drives 56 in the multi-drive system 42 and receiving corresponding responses individually or jointly reporting the latest operating frequency Fdrive.

At 136, the GFL system 48 identifies a set or list of "n" suspected drives for which the current operating frequency Fdrive of the motor drive 46 is within a range including the fault frequency Fng. As in the above self-diagnosis operation of the individual drives 56, the GFL system 48 at 136 determines whether a given drive 56 is operating at or near the fault frequency Fng (e.g., Fng+/−ΔF, Fng+/−2%, between Fng+2% and Fng−1%, etc.). A determination is made at 138 as to whether the set is empty (n=0) and if so (YES at 138), the system 48 determines at 140 whether the fault frequency Fng is near a line frequency of the multi-drive system 42 (e.g., near the fundamental frequency of the AC source 52 in FIGS. 1 and 2 above). If so (YES at 140), the GFL system 48 identifies a shared AC or DC bus ground fault (e.g., system ground fault) at 142, and otherwise (NO at 140) signals a fault for further troubleshooting at 144.

If there is at least one motor drive 46 operating at or near the fault frequency Fng (NO at 138), the GFL system 48 determines at 146 whether only a single drive 56 is suspected (n=1). If so (YES at 146), the system 48 confirms at 148 that the detected ground fault is located at the single suspected drive 56.

If more than one drive 56 is suspected (e.g., operating at or near the fault frequency Fng (NO at 146), the GFL system 48 selects a first suspected drive at 150 and sends a speed command change, preferably within a system tolerance range (e.g. +/−5% in one embodiment) to the selected drive 56 at 152 and receives an updated fault frequency $Fng_{NEW}$ (e.g., from the selected drive 56, or from another ground fault detection system 46 in the multi-drive system 42) while any remaining drives 56 in the system 42 can continue operation at their respective current operating frequencies Fdrive. A determination is made at 154 by the GFL system 48 as to whether the updated ground fault frequency has changed by a predetermined amount (e.g., $|Fng_{OLD}-Fng_{NEW}|$ is less than a threshold $F_{TH}$). If so (YES at 154), the system 48 confirms that the detected ground fault is located at the selected drive at 156. Otherwise (NO at 154), the GFL system 48 confirms that no fault exists in the selected drive at 158.

The GFL system 48 then determines at 160 whether the selected drive 56 is the last suspect, and if so (YES) proceeds to analyze whether the fault frequency Fng is near the line frequency at 140 and selectively identifies a system ground fault at 142 if so, as described above. Otherwise (NO at 160), the GFL system 48 selects the next suspected drive in the set at 152 and returns to 152-158 to assess whether the newly selected suspect drive 56 is the source of the detected ground fault through selective operating frequency adjustment and reassessment of the fault frequency while the other drives 56 continue operation at their corresponding designated operating frequencies as described above. In this manner, the ground fault location system 48 (whether implemented in a PLC 44, in a motor drive 56, or in a separate processor-based system 66) advantageously performs automatic system diagnosis to identify whether an operating motor drive 56 is the location or cause of a detected high resistance ground fault in the multi-drive system 42 without disturbing operation of the running drives 56. In this regard, the selective adjustment of the operating frequency of a selected drive 56 (at 152 in FIG. 6) is preferably done such that the selected drive continues to operate within a designated system tolerance range around the desired command speed for that drive. In this manner, even the selected drive 56 which is being analyzed at any given time is still operating within acceptable limits. Thus, the ground fault location concepts disclosed in the described embodiments advantageously reduce system downtime and mitigate excessive manual troubleshooting in multi-drive systems 42 to expeditiously identify the source or location of a high resistance ground fault while minimizing cost.

The above examples are merely illustrative of several possible embodiments of various aspects of the present disclosure, wherein equivalent alterations and/or modifications will occur to others skilled in the art upon reading and understanding this specification and the annexed drawings. In particular regard to the various functions performed by the above described components (assemblies, devices, systems, circuits, and the like), the terms (including a reference to a "means") used to describe such components are intended to correspond, unless otherwise indicated, to any component, such as hardware, processor-executed software, or combinations thereof, which performs the specified function of the described component (i.e., that is functionally equivalent), even though not structurally equivalent to the disclosed structure which performs the function in the illustrated implementations of the disclosure. In addition, although a particular feature of the disclosure may have been disclosed with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

The following is claimed:

1. A method for identifying a suspected ground fault location in a multi-drive system having a plurality of drives, the method comprising:
    using at least one processor, while a given drive is operating, determining whether an operating frequency of the given drive is within a range including a fault frequency corresponding to a detected ground fault condition in the system; and
    using the at least one processor, selectively identifying the given drive as a suspected ground fault location if the operating frequency of the given drive is within the range including the fault frequency, wherein selectively identifying the given drive comprises:
    using the at least one processor, identifying a set of drives in the multi-drive system operating at corresponding frequencies within the range including the fault frequency;
    if the set includes a single drive, selectively identifying the single drive as a ground fault location in the system; and
    if the set includes more than one drive, using the at least one processor:
        (i) changing an operating frequency of a single selected drive in the set while any remaining drives in the set continue operation at their respective current operating frequencies,
        (ii) selectively identifying the single selected drive as a ground fault location in the system if the fault frequency changes by more than a threshold amount in response to changing the operating frequency of the single selected drive,
        (iii) selectively confirming the single selected drive is not a ground fault location if the fault frequency does not change by more than the threshold amount in response to changing the operating frequency of the single selected drive, and
        (iv) selectively repeating steps (i)-(iii) for the remaining drives in the set.

2. The method of claim 1, comprising:
    measuring a neutral-ground voltage in the multi-drive system;
    determining whether an integral of the neutral-ground voltage is greater than or equal to a threshold value; and selectively identifying a detected ground fault condition in the system if the integral of the neutral-ground voltage is greater than or equal to the threshold value.

3. The method of claim 2, comprising determining the fault frequency as a frequency of the neutral-ground voltage if the integral of the neutral-ground voltage is greater than or equal to the threshold value.

4. The method of claim 1, wherein the at least one processor is integral to the given drive, the method comprising:
using the at least one processor, automatically obtaining a measured neutral-ground voltage associated with the given drive while the given drive is operating at a commanded frequency;
using the at least one processor, selectively identifying a detected ground fault condition in the given drive if an integral of the measured neutral-ground voltage is greater than or equal to a threshold value; and
using the at least one processor, determining the fault frequency as a frequency of the measured neutral-ground voltage if a detected ground fault condition has been identified in the given drive; and
using the at least one processor, selectively identifying the given drive as a suspected ground fault location if the operating frequency of the given drive is within the range including the fault frequency.

5. The method of claim 4, further comprising, using the at least one processor, reporting a detected fault condition, an operating frequency of the given drive, and the fault frequency to a device in the multi-drive system.

6. The method of claim 5, further comprising,
using the at least one processor, receiving a speed command change from the device in the multi-drive system;
using the at least one processor, operating the given drive at an adjusted operating frequency according to the received speed command change; and
using the at least one processor, determining an updated fault frequency as a frequency of the measured neutral-ground voltage while operating the given drive at the adjusted operating frequency; and
using the at least one processor, reporting the updated fault frequency to the device in the multi-drive system.

7. The method of claim 1, wherein the fault frequency is a frequency associated with a neutral-ground signal in the system.

8. The method of claim 1, comprising:
using the at least one processor, if the set includes no drives, or if the fault frequency does not change by more than the threshold amount in response to changing the operating frequency of any of the drives in the set, selectively identifying a system ground fault if the fault frequency is at or near a line frequency associated with the system.

9. The method of claim 8, wherein the fault frequency is a frequency associated with a neutral-ground signal in the system.

10. The method of claim 1, wherein the fault frequency is a frequency associated with a neutral-ground signal in the system.

11. A computer readable medium with computer executable instructions for automatically identifying a suspected ground fault location in a multi-drive system having a plurality of drives, the computer readable medium comprising computer executable instructions for:
determining whether an operating frequency of a given drive is within a range including a fault frequency corresponding to a detected ground fault condition in the system while the given drive is operating; and
selectively identifying the given drive as a suspected ground fault location if the operating frequency of the given drive is within the range including the fault frequency, wherein selectively identifying the given drive comprises:
using the at least one processor, identifying a set of drives in the multi-drive system operating at corresponding frequencies within the range including the fault frequency;
if the set includes a single drive, selectively identifying the single drive as a ground fault location in the system; and
if the set includes more than one drive, using the at least one processor:
(i) changing an operating frequency of a single selected drive in the set while any remaining drives in the set continue operation at their respective current operating frequencies,
(ii) selectively identifying the single selected drive as a ground fault location in the system if the fault frequency changes by more than a threshold amount in response to changing the operating frequency of the single selected drive,
(iii) selectively confirming the single selected drive is not a ground fault location if the fault frequency does not change by more than the threshold amount in response to changing the operating frequency of the single selected drive, and
(iv) selectively repeating steps (i)-(iii) for the remaining drives in the set.

12. A ground fault location system for identifying a suspected ground fault location in a multi-drive system having a plurality of drives, comprising:
an electronic memory;
a network interface operative to provide electronic communications between the system and a plurality of motor drives via a connected communications network; and
at least one processor electrically coupled to the electronic memory and to the network interface, the at least one processor being programmed to:
determine whether an operating frequency of a given drive is within a range including a fault frequency corresponding to a detected ground fault condition in the system while the given drive is operating, and
selectively identify the given drive as a suspected ground fault location if the operating frequency of the given drive is within the range including the fault frequency,
identify a set of drives in the multi-drive system operating at corresponding frequencies within the range including the fault frequency;
if the set includes a single drive, selectively identify the single drive as a ground fault location in the system; and
if the set includes more than one drive:
(i) change an operating of a single selected drive in the set while any remaining drives in the set continue operation at their respective current operating frequencies,
(ii) selectively identify the single selected drive as a ground fault location in the system if the fault frequency changes by more than a threshold amount in response to changing the operating frequency of the single selected drive,
(iii) selectively confirm the single selected drive is not a ground fault location if the fault frequency does not change by more than the threshold amount in response to changing the operating frequency of the single selected drive, and (iv) selectively repeat steps (i)-(iii) for the remaining drives in the set.

13. The system of claim 12, wherein the fault frequency is a frequency associated with a neutral-ground signal in the system.

14. The system of claim 12, wherein the at least one processor is programmed to:
   automatically obtain a measured neutral-ground voltage associated with the given drive while the given drive is operating at a commanded frequency;
   selectively identify a detected ground fault condition in the given drive if an integral of the measured neutral-ground voltage is greater than or equal to a threshold value; and
   determine the fault frequency as a frequency of the measured neutral-ground voltage if a detected ground fault condition has been identified in the given drive; and
   selectively identify the given drive as a suspected ground fault location if the operating frequency of the given drive is within the range including the fault frequency.

15. The system of claim 14, wherein the at least one processor is programmed to report a detected fault condition, an operating frequency of the given drive, and the fault frequency to a device in the multi-drive system.

16. The system of claim 15, wherein the at least one processor is programmed to:
   receive a speed command change from the device in the multi-drive system;
   operate the given drive at an adjusted operating frequency according to the received speed command change;
   determine an updated fault frequency as a frequency of the measured neutral-ground voltage while operating the given drive at the adjusted operating frequency; and
   report the updated fault frequency to the device in the multi-drive system.

17. The system of claim 12, wherein the at least one processor is programmed to:
   if the set includes no drives, or if the fault frequency does not change by more than the threshold amount in response to changing the operating frequency of any of the drives in the set, selectively identify a system ground fault if the fault frequency is at or near a line frequency associated with the system.

18. The system of claim 17, wherein the fault frequency is a frequency associated with a neutral-ground signal in the system.

* * * * *